(12) United States Patent
Shih

(10) Patent No.: US 12,249,385 B2
(45) Date of Patent: Mar. 11, 2025

(54) INTERFACE CIRCUIT, MEMORY CONTROLLER AND METHOD FOR CALIBRATING SIGNAL PROCESSING DEVICES IN AN INTERFACE CIRCUIT

(71) Applicant: Silicon Motion, Inc., Hsinchu County (TW)

(72) Inventor: Fu-Jen Shih, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 80 days.

(21) Appl. No.: 18/225,654

(22) Filed: Jul. 24, 2023

(65) Prior Publication Data

US 2024/0363183 A1 Oct. 31, 2024

(30) Foreign Application Priority Data

Apr. 25, 2023 (TW) ................. 112115327

(51) Int. Cl.
*G11C 29/12* (2006.01)
(52) U.S. Cl.
CPC .... *G11C 29/1201* (2013.01); *G11C 29/12005* (2013.01); *G11C 2207/2254* (2013.01)
(58) Field of Classification Search
CPC ...... G11C 2207/2254; G11C 29/12005; G11C 29/1201
See application file for complete search history.

(56) References Cited

U.S. PATENT DOCUMENTS

| 6,564,288 | B2 | 5/2003 | Olarig |
| 2013/0202008 | A1 | 8/2013 | Myers |
| 2015/0074437 | A1* | 3/2015 | Ware ............. G11C 7/1093 |
| | | | 713/400 |
| 2017/0131153 | A1 | 5/2017 | Cirit |
| 2021/0141747 | A1* | 5/2021 | Jeong ............. G11C 7/109 |
| 2022/0113881 | A1 | 4/2022 | Roberts |

FOREIGN PATENT DOCUMENTS

| CN | 102759661 A | 10/2012 |
| TW | 201614984 A | 4/2016 |
| TW | I792732 B | 2/2023 |

OTHER PUBLICATIONS

Shih, the specification, including the claims, and drawings in the U.S. Appl. No. 18/225,670, filed Jul. 24, 2023.

* cited by examiner

*Primary Examiner* — Mohammed A Bashar
(74) *Attorney, Agent, or Firm* — Winston Hsu

(57) ABSTRACT

A method for calibrating a characteristic value of a signal processing device comprised in SerDes inside of an interface circuit of a memory controller includes: monitoring a current of a voltage of a test element to generate a process detection result by a monitor and calibration module; monitoring an environment temperature to generate a temperature monitored result by the monitor and calibration module; selecting a reference value subset from multiple reference value subsets as a preferred reference value subset for a calibration operation based on the process detection result and the temperature monitored result; and performing the calibration operation on the signal processing device by at least one calibration circuit of the monitor and calibration module according to the preferred reference value subset to adjust the characteristic value of the signal processing device.

20 Claims, 9 Drawing Sheets

INTERFACE CIRCUIT, MEMORY CONTROLLER AND METHOD FOR CALIBRATING SIGNAL PROCESSING DEVICES IN AN INTERFACE CIRCUIT

BACKGROUND OF THE INVENTION

1. Field of the Invention

The invention relates to a method for calibrating signal processing devices in an interface circuit, more particularly to a method for selecting reference values provided to the calibration circuits based on a process and dynamically adjusting the reference values based on a temperature, to efficiently calibrate the signal processing devices in the interface circuit so as to compensate for drift in current, voltage and/or frequency in real-time and to avoid fatal error.

2. Description of the Prior Art

Serializer-Deserializer (SerDes) is a pair of function blocks commonly used in high-speed communication to compensate for limited input/output. SerDes is configured to convert data between serial data and parallel interfaces in either direction. The primary purpose of a SerDes is to provide data transfer over a single line or a differential pair to minimize the number of input/output pins and interconnects.

SerDes operates at high frequency. However, high frequency signal transmission has low tolerance to frequency or voltage jitter. In addition, the use of advanced process technology also easily leads to some problems such as frequency and voltage jitter or drift in the SerDes, and the variation of the process will also cause the problem of excessive variation in circuit performance, which will eventually lead to excessive variation in the characteristic values of the signal processing devices in the SerDes. If the characteristic values of the signal processing devices in the SerDes drift, the frequency or voltage jitter caused by the drift may cause fatal errors to the signal processing in SerDes. Once a fatal error occurs, the system must be powered off or reset, causing a lot of inconvenience.

Since the process variation is unavoidable, no matter how rigorous and excellent it is in the design or manufacturing stage of the wafer product, the variation between products will inevitably exist after production is completed. In view of this, in order to avoid fatal errors in high-speed communication systems, a method using preferred reference values to facilitate the calibration circuit to efficiently and accurately calibrate the characteristic values of the internal signal processing devices of the SerDes so as to compensate for drift in current, voltage and/or frequency is required.

SUMMARY OF THE INVENTION

According to an embodiment of the invention, an interface circuit comprises a signal processing circuit configured to process a reception signal received from a host device and a transmission signal to be transmitted to the host device. The signal processing circuit comprises a plurality of signal processing devices and a monitor and calibration module. The monitor and calibration module comprises a process monitor, a temperature monitor, a processor and a calibration circuit. The process monitor is configured to monitor a current or a voltage of a test element to generate a process detection result. The temperature monitor is configured to monitor an environment temperature to generate a temperature monitored result. The processor is configured to receive the process detection result and the temperature monitored result and select a reference value subset as a preferred reference value subset for a calibration operation from a plurality of reference value subsets based on the process detection result and the temperature monitored result. The calibration circuit is coupled to the processor and at least one of the signal processing devices and configured to perform the calibration operation on the at least one of the signal processing devices according to the preferred reference value subset and in response to a control signal issued by the processer, to adjust a characteristic value of the at least one of the signal processing devices.

According to an embodiment of the invention, a memory controller coupled to a memory device to control access operations of the memory device comprises a host interface configured to communicate with a host device and comprising a signal processing circuit to process a reception signal received from the host device and a transmission signal to be transmitted to the host device. The signal processing circuit comprises a plurality of signal processing devices and a monitor and calibration module. The monitor and calibration module comprises a process monitor, a temperature monitor, a processor and a calibration circuit. The process monitor is configured to monitor a current or a voltage of a test element to generate a process detection result. The temperature monitor is configured to monitor an environment temperature to generate a temperature monitored result. The processor is configured to receive the process detection result and the temperature monitored result and select a reference value subset as a preferred reference value subset for a calibration operation from a plurality of reference value subsets based on the process detection result and the temperature monitored result. The calibration circuit is coupled to the processor and at least one of the signal processing devices and configured to perform the calibration operation on the at least one of the signal processing devices according to the preferred reference value subset in response to a control signal issued by the processor to adjust a characteristic value of the at least one of the signal processing devices.

According to an embodiment of the invention, a method for calibrating characteristic values of a plurality of signal processing devices comprised in SerDes inside of an interface circuit of a memory controller comprises: monitoring a current or a voltage of a test element to generate a process detection result by a monitor and calibration module; monitoring an environment temperature to generate a temperature monitored result by the monitor and calibration module; selecting a reference value subset as a preferred reference value subset for a calibration operation from a plurality of reference value subsets based on the process detection result and the temperature monitored result; and performing the calibration operation on at least one of the signal processing devices by at least one calibration circuit of the monitor and calibration module according to the preferred reference value subset to adjust a characteristic value of the at least one of the signal processing devices.

These and other objectives of the present invention will no doubt become obvious to those of ordinary skill in the art after reading the following detailed description of the preferred embodiment that is illustrated in the various figures and drawings.

DETAILED DESCRIPTION

In the following, numerous specific details are described to provide a thorough understanding of embodiments of the invention. However, one of skilled in the art will understand how to implement the invention in the absence of one or more specific details, or relying on other methods, elements or materials. In other instances, well-known structures, materials or operations are not shown or described in detail in order to avoid obscuring the main concepts of the invention.

Reference throughout this specification to "one embodiment", "an embodiment", "one example" or "an example" means that a particular feature, structure or characteristic described in connection with the embodiment or example is included in at least one embodiment of a plurality of embodiments. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples.

In addition, in order to make the objects, features and advantages of the invention more comprehensible, specific embodiments of the invention are set forth in the accompanying drawings. This description is made for the purpose of illustrating the general principles of the invention and should not be taken in a limiting sense. It should be understood that the following embodiments can be implemented by software, hardware, firmware, or any combination thereof.

Figure 1:
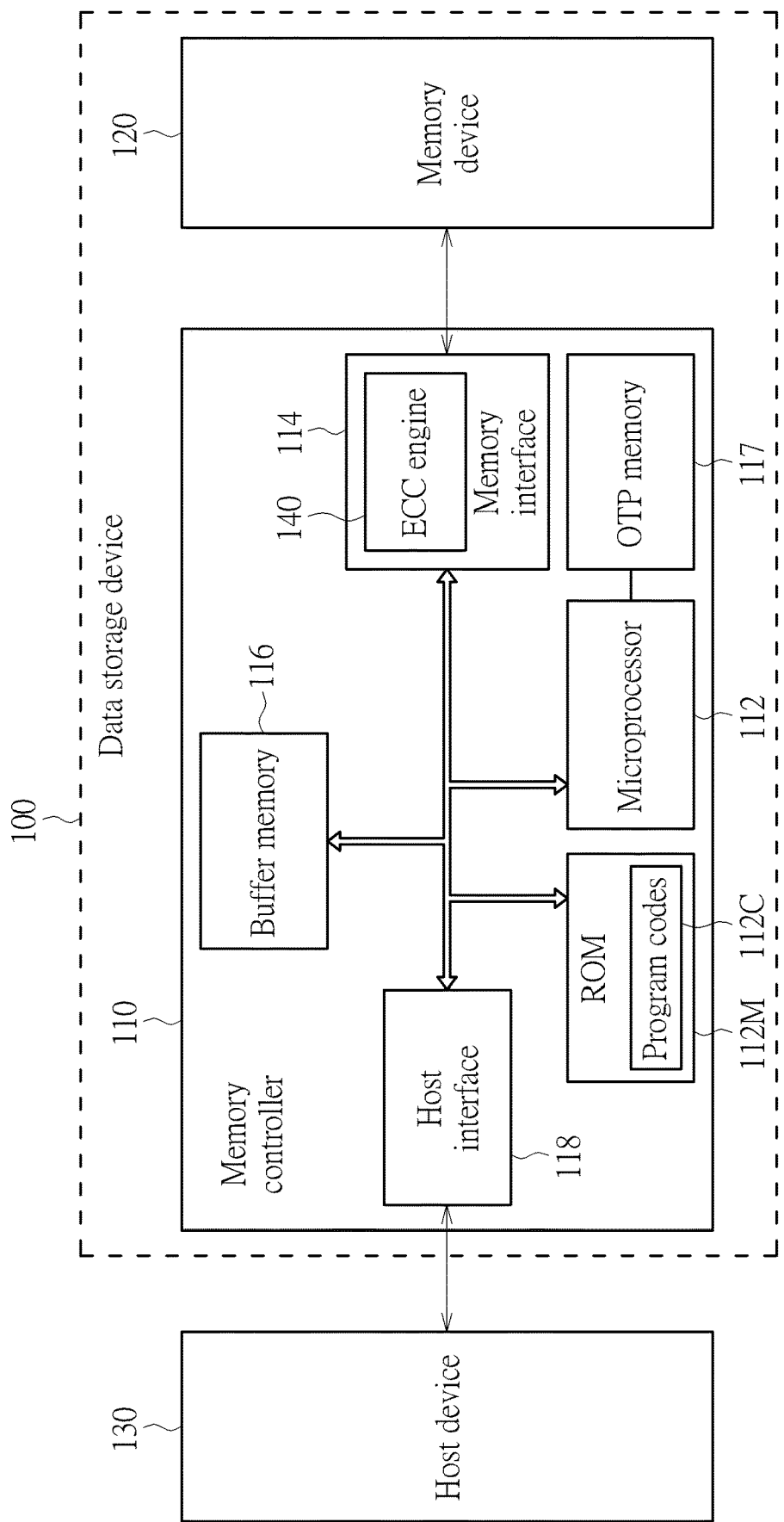
FIG. 1 is an exemplary block diagram of a data storage device according to an embodiment of the invention.

FIG. 1 is an exemplary block diagram of a data storage device according to an embodiment of the invention. The data storage device 100 may comprise a memory device 120 and a memory controller 110. The memory controller 110 is configured to access the memory device 120 and control operations of the memory device 120. The memory device 120 may be a non-volatile (NV) memory (e.g. a Flash memory) device and may comprise one or more memory elements (e.g. one or more Flash memory dies, or one or more Flash memory chip, or the likes).

The data storage device 100 may be coupled to a host device 130. The host device 130 may comprise at least one processor, a power supply circuit, and at least one random access memory (RAM), such as at least one dynamic RAM (DRAM), at least one static RAM (SRAM), . . . etc. (not shown in FIG. 1). The processor and the RAM may be coupled to each other through a bus, and may be coupled to the power supply circuit to obtain power. The processor may be arranged to control operations of the host device 130, and the power supply circuit may be arranged to provide the processor, the RAM, and the data storage device 100 with power. For example, the power supply circuit may output one or more driving voltages to the data storage device 100. The data storage device 100 may obtain the one or more driving voltages from the host device 130 as the power of the data storage device 100 and provide the host device 130 with storage space.

According to an embodiment of the invention, the host device 130 may issue commands, such as the read command or the write command, to the data storage device 100, so as to access the data stored in the memory device 120, or the host device 130 may issue commands to further control or manage the data storage device 100.

According to an embodiment of the invention, the memory controller 110 may comprise a microprocessor 112, a Read Only Memory (ROM) 112M, a memory interface 114, a buffer memory 116 and a host interface 118. The ROM 112M is configured to store program codes 112C. The microprocessor 112 is configured to execute the program codes 112C, thereby controlling access to the memory device 120. The program codes 112C may comprise one or more program modules, such as the boot loader code. When the data storage device 100 obtains power from the host device 130, the microprocessor 112 may perform an initialization procedure of the data storage device 100 by executing the program codes 112C. In the initialization procedure, the microprocessor 112 may load a group of In-System Programming (ISP) codes (not shown in FIG. 1) from the memory device 120. The microprocessor 112 may execute the group of ISP codes, so that the data storage device 100 has various functions. According to an embodiment of the invention, the group of ISP codes may comprise, but are not limited to: one or more program modules related to memory access (e.g. read, write and erase), such as a read operation module, a table lookup module, a wear leveling module, a read refresh module, a read reclaim module, a garbage collection module, a sudden power off recovery (SPOR) module and an uncorrectable error correction code (UECC) module, respectively provided for performing the operations of read, table lookup, wear leveling, read refresh, read reclaim, garbage collection, SPOR and error handling for detected UECC error.

The memory interface 114 may comprise an error correction code (ECC) engine 140. The ECC engine 140 may comprise a data buffer (not shown in FIG. 1) for buffering data to assist the ECC engine 140 in performing the encoding and decoding on the data. In the write procedure to write data into the memory device 120, the ECC engine 140 is configured to encode the data to be written into the memory device 120, such as performing the ECC encoding, so as to generate extra parity bits. In the read procedure to read data from the memory device 120, the ECC engine 140 is configured to decode the data read from the memory device 120 to detect the error bit(s) in the data and correct the value(s) of the error bit(s) when the error is correctable (e.g., the number of error bits does not exceed the maximum number of error bits that can be corrected by the ECC engine 140).

In addition, according to an embodiment of the invention, the memory controller 110 may further comprise a One Time Programmable (OTP) memory 117. The OTP memory 117 may be configured to store data for special application. The developer or manufacturer of the memory controller 110 may write data into the OTP memory 117 by using electric power, and the data will be permanently programmed in the OTP memory 117. The OTP memory 117 may be accessed by all devices in the memory controller 110. As an example, the OTP memory 117 may be coupled to the microprocessor 112, and the microprocessor 112 may access the OTP memory 117 to obtain the aforementioned data for special application and provide the aforementioned data for special application to other devices. Similarly, the OTP memory 117 may be coupled to the host device 118, and the internal processing circuit or the processor of the host device 118 may access the OTP memory 117 to obtain the aforementioned data for special application.

Typically, the memory device 120 may comprise a plurality of memory elements, such as a plurality of Flash memory dies or Flash memory chips, and each memory element may comprise a plurality of memory blocks. The access unit of an erase operation performed by the memory controller 110 on the memory device 120 may be one memory block. In addition, a memory block may record (comprise) a predetermined number of pages, for example, the physical pages, and the access unit of a write operation performed by the memory controller 110 on the memory device 120 may be one page.

In practice, the memory controller 110 may perform various control operations by using its own internal components. For example, the memory controller 110 may use the memory interface 114 to control the access operations (especially the access operation for at least a memory block or at least a page) of the memory device 120, use the buffer memory 116 to perform necessary data buffer operations, and use the host interface 118 to communicate with the host device 130.

In an embodiment of the invention, the memory controller 110 may use the host interface 118 to communicate with the host device 130 in compliance with a standard communication protocol. For example, the standard communication protocol may comprise (but is not limited to) the Universal Serial Bus (USB) standard, the SD interface standard, the Ultra High Speed-I (UHS-I) interface standard, the Ultra High Speed-II (UHS-II) interface standard, the CF interface standard, the Multi Media Card (MMC) interface standard, the eMMC interface standard, the UFS interface standard, the Advanced Technology Attachment (ATA) standard, the Serial ATA (SATA) standard, the Peripheral Component Interconnect Express (PCI-E) standard, the Parallel Advanced Technology Attachment (PATA) standard, etc.

In an embodiment, the buffer memory 116 for buffering data may be implemented by a RAM. For example, the buffer memory 116 may be an SRAM, but the invention should not be limited thereto. In other embodiments, the buffer memory 116 may be a DRAM.

In an embodiment of the invention, the data storage device 100 may be a portable storage device (for example, the memory card in compliance with the SD/MMC, CF, MS and/or XD standard, the USB flash drive, or the likes), and the host device 130 may be an electronic device, such as a mobile phone, a notebook computer, a desktop computer . . . etc., capable of connecting to the data storage device. In another embodiment of the invention, the data storage device 100 may be a solid state hard disk or an embedded storage device in compliance with the UFS or the eMMC standards, and may be equipped in an electronic device such as a mobile phone, a notebook computer, or a desktop computer. In such an embodiment, the host device 130 may be a processor of the electronic device.

According to an embodiment of the invention, the host interface 118 of the memory controller 110 may comprise a Serializer-Deserializer (SerDes) configured to process a reception signal received from a host device and a transmission signal to be transmitted to the host device, so as to realize high speed data transmission between the data storage device 100 and the host device 130.

Figure 2:
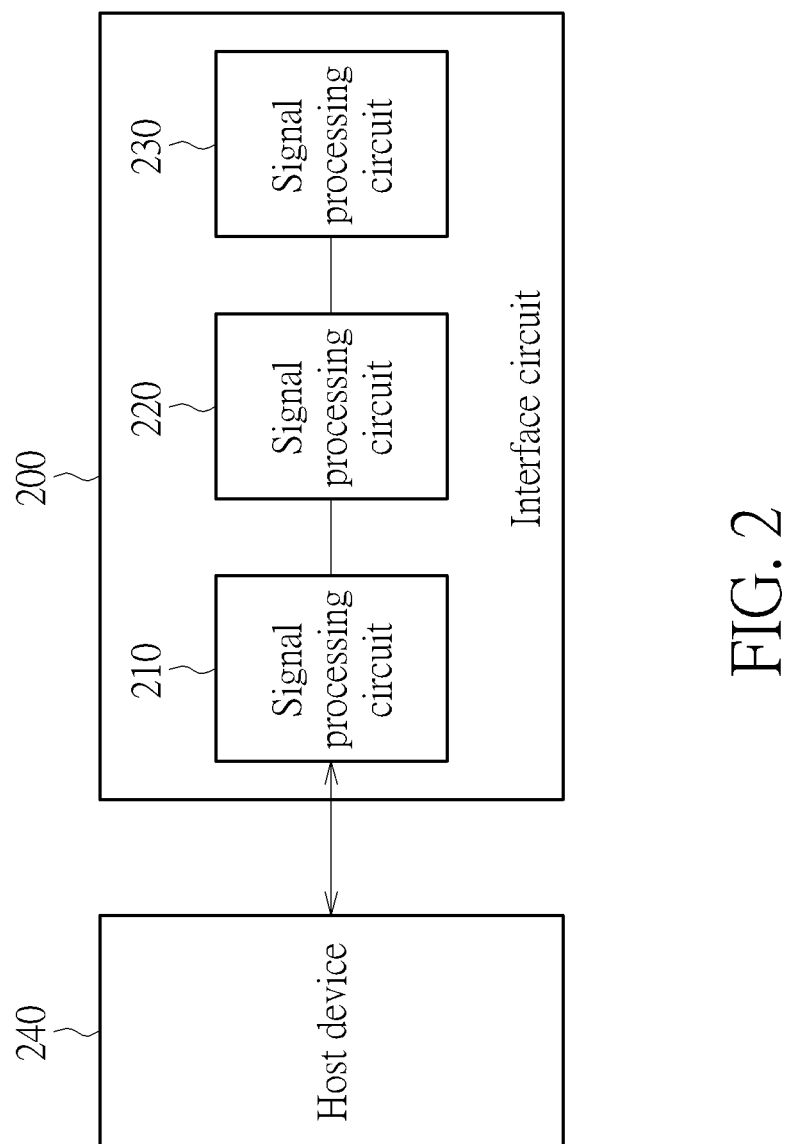
FIG. 2 is an exemplary block diagram of an interface circuit according to an embodiment of the invention.

FIG. 2 is an exemplary block diagram of an interface circuit according to an embodiment of the invention. According to an embodiment of the invention, the interface circuit 200 may be a host interface disposed between a predetermined device (as an example, a data storage device) and a host device for the host device and the predetermined device to communicate with each other through the interface circuit 200 and transmit data signal and control signal therethrough. According to an embodiment of the invention, the interface circuit 200 may be the host interface 118 configured inside the memory controller 110 as shown in FIG. 1.

The interface circuit 200 may comprise signal processing circuits 210, 220 and 230 that operate in compliance with different layer communication protocols. The signal processing circuit 210 may be the physical layer signal processing circuit to process reception signals received from the host device 240 and the transmission signals to be transmitted to the host device 240 in compliance with physical layer communication protocol. As an example, the signal processing circuit 210 may perform physical layer operations, such as amplification or attenuation, analog-to-digital or digital-to-analog conversion, frequency mixing, basic encoding or decoding, and unpacking of physical layer packet, on the reception signals and transmission signals. The signal processing circuit 220 may be the protocol layer signal processing circuit configured to perform corresponding signal processing on reception signals and the transmission signals in compliance with another layer communication protocol above the physical layer. As an example, the signal processing circuit 220 may perform signal processing on the reception signals and the transmission signals in compliance with the Unified Protocol (UniPro) developed by the Mobile Industry Processor Interface (MIPI) alliance. The signal processing circuit 220 may comprise multiple layers of signal processing circuits, for example, a physical adapter (PA) layer signal processing circuit which is coupled to the physical layer signal processing circuit, and other layers of signal processing circuits. The signal processing circuit 230 may be the application layer signal processing circuit configured to perform higher layer signal processing in compliance with the application layer protocol.

In the embodiments of the invention, the signal processing circuit 210 may be a SerDes or may be the physical layer signal processing circuit of the SerDes, to implement the high-speed data and signal transmission between the aforementioned predetermined device and host device.

Figure 3:
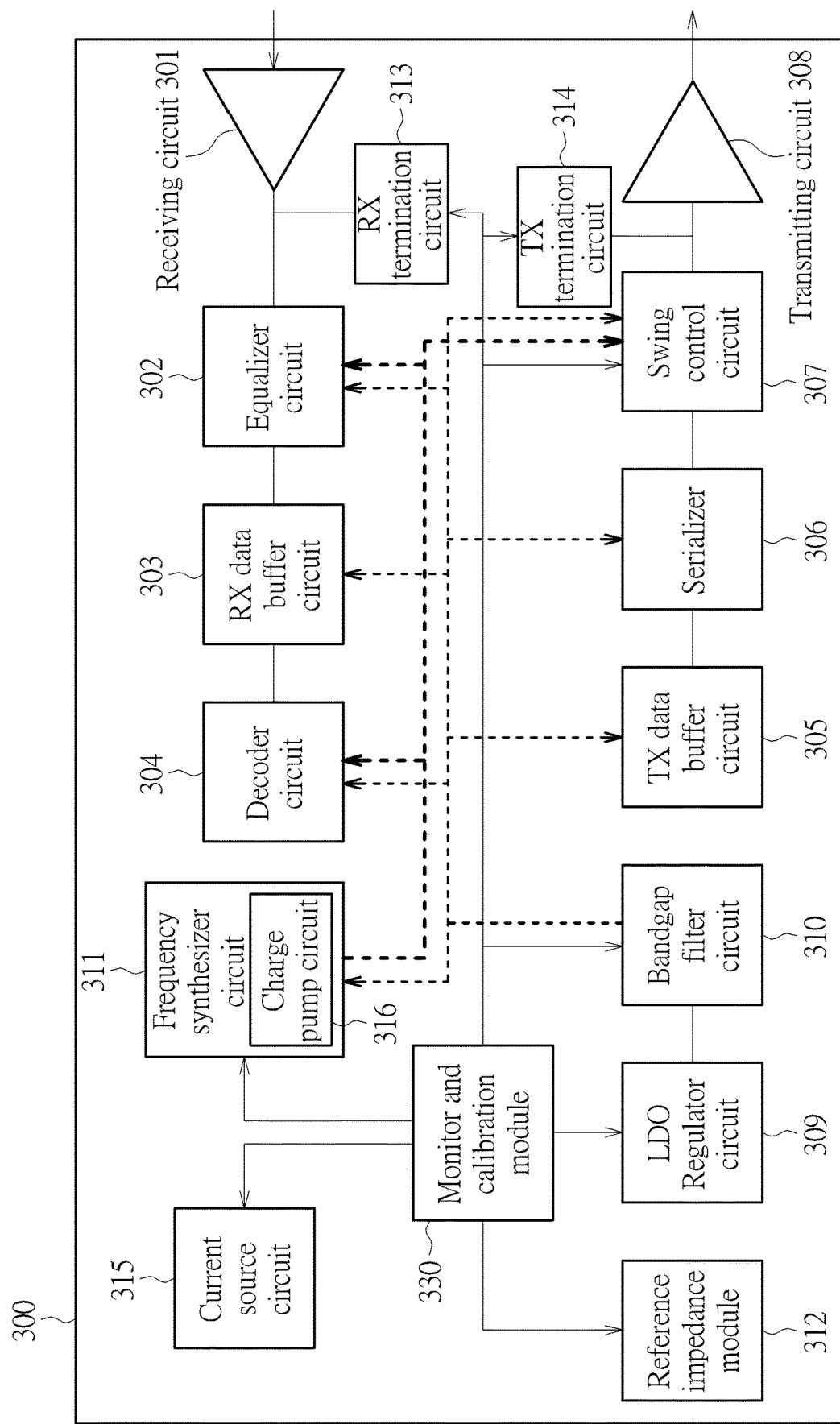
FIG. 3 is an exemplary block diagram of a signal processing circuit according to an embodiment of the invention.

FIG. 3 is an exemplary block diagram of a signal processing circuit according to an embodiment of the invention. In this embodiment, the signal processing circuit 300 may be a physical layer signal processing circuit configured inside an interface circuit, such as the physical layer signal processing circuit in the host interface of a memory controller, or the signal processing circuit 300 may be a Serializer-Deserializer (SerDes) or the physical layer signal processing circuit of the SerDes, and the signal processing circuit 300 may be configured to process the reception signals and the transmission signals.

The signal processing circuit 300 may comprise a plurality of signal processing devices and a monitor and calibration module 330. The monitor and calibration module 330 may be a circuit set which comprises a plurality of monitor circuits, a plurality of calibration circuits and a plurality of reference value subset storage circuits, and may be coupled to multiple signal processing devices. The monitor circuits are configured to perform monitor and/or measurement operations. For example, a monitor circuit may be configured to monitor a current or a voltage performance of a test element inside of the memory controller 110 and to determine a process parameter corresponding to the memory controller 110, and a monitor circuit may be configured to keep monitoring an environment temperature. The calibration circuits may be configured to sequentially calibrate a characteristic value of the signal processing devices in a monitor and calibration procedure according to the measured or monitored results.

The signal processing devices in the signal processing circuit 300 may comprise a receiving circuit 301, an equalizer circuit 302, a reception (RX) data buffer circuit 303, a decoder circuit 304, a transmission (TX) data buffer circuit 305, a serializer 306, a swing control circuit 307, a transmitting circuit 308, a Low DropOut (LDO) Regulator circuit 309, a bandgap filter circuit 310, a frequency synthesizer circuit 311, a reference impedance module 312, a RX termination circuit (reception termination circuit) 313, a TX termination circuit (transmission termination circuit) 314, a charge pump circuit 316 and at least one current source circuit 315.

It is to be noted that FIG. 3 is a simplified schematic diagram of a signal processing circuit, in which only the components related to the invention are shown. Those skilled in the art will be readily appreciated that a physical layer signal processing circuit may also comprise many components not shown in FIG. 3 to implement the corresponding physical layer signal processing functions.

On the reception signal processing path, the receiving circuit 301 is configured to receive signal from the host device. The RX termination circuit 313 is coupled to the reception signal processing path to provide a predetermined impedance on the reception signal processing path, for the load on the reception signal processing path to match with the impedance of the signal transmission line. The equalizer circuit 302 is configured to perform equalization on the reception signals. The equalizer circuit 302 may comprise a Continuous Time Linear Equalizer (CTLE), a Clock Data Recovery (CDR) circuit and a Deserializer (not shown in FIG. 3). The CTLE is configured to process the reception signal which being a serial signal. The CDR circuit is configured to regenerate the clock signal which is synchronized with the one used at the transmitter side and to accurately recover the content of the data signal carried in the reception signal according to the clock signal. The Deserializer is configured to convert the serial data signal into a plurality of parallel signals transmitted in parallel through a plurality of buses and output the parallel signals. The RX data buffer circuit 303 is configured to buffer the reception data output by the equalizer circuit 302. The decoder circuit 304 is configured to decode the reception data. The decoded reception data is further provided to the upper layer signal processing circuit, such as the physical adapter (PA) layer signal processing circuit.

On the transmission signal processing path, the TX data buffer circuit 305 is configured to buffer the transmission data, e.g., parallel data signals, received from the upper layer signal processing circuit. The serializer 306 is configured to convert the parallel data signals into a serial data signal. The swing control circuit 307 is configured to control the swing of transmission signal, for example, adjust the voltage of the transmission signal to an adequate level. The transmitting circuit 308 is configured to transmit the transmission signal to the host device. The TX termination circuit 314 is coupled to the transmission signal processing path to provide a predetermined impedance on the transmission signal processing path, for the load on the transmission signal processing path to match with the impedance of the signal transmission line.

Besides the signal processing devices on the aforementioned reception signal processing path and transmission signal processing path, the signal processing circuit 300 may also comprise some common circuits configured to provide the frequency, current, voltage, power and/or information regarding reference impedance that are required by other signal processing devices. The LDO Regulator circuit 309 is configured to provide stable voltage signal, as an example, provide stable voltage signal to the bandgap filter circuit 310. The bandgap filter circuit 310 is configured to filter the noise in the voltage signal, so as to provide clean voltage signal to the other signal processing devices (such as the arrows with thin dotted line in FIG. 3). The frequency synthesizer circuit 311 is configured to generate the clock signal required in the signal processing circuit 300 and provide the clock signal to the other signal processing devices (such as the arrows with thick dotted line in FIG. 3). In an embodiment of the invention, the frequency synthesizer circuit 311 may be implemented by a Phase Locked Loop (PLL) and configured to generate an oscillating signal provided as the clock signal required in the signal processing circuit 300, and may comprise a charge pump circuit 316 configured to generate an output voltage V_CP as an input signal provided to a voltage controlled oscillator (VCO) comprised in the PLL.

The reference impedance module 312 may comprise a plurality of reference passive devices, as an example, the reference resistors, reference capacitors, the reference inductors, or the likes, that are provided as reference impedance. Since the characteristic values of the passive devices, such as the corresponding resistance, capacitance, inductance, or the likes, may drift due to the process variation, the reference impedance module 312 comprising the passive devices made by the same process may be configured inside the signal processing circuit 300 to provide information regarding the reference impedance. As an example, suppose that 10 Kohms is achieved by connecting the two reference resistive devices in the reference impedance module 312 in serial, this information may be provided as reference impedance information. When a signal processing device inside the signal processing circuit 300 requires the resistance of 10 Kohms, two resistors inside this signal processing device may be connected together in serial by controlling the internal switch circuit thereof according to the reference impedance information. When another signal processing device inside the signal processing circuit 300 requires the resistance of 20 Kohms, four resistors inside this signal processing device may be connected together in serial by controlling the internal switch circuit thereof according to the reference impedance information. By using the reference impedance information obtained in the same circuit to flexibly control the number of passive devices to be connected in parallel or serial, the problem of characteristic value drift due to process variation is effectively overcome. The application regarding the corresponding reference impedance information of other passive devices comprised in the reference impedance module 312 may be deduced by analogy. The current source circuit 315 is configured to provide a current required by the signal processing devices in the signal processing circuit 300.

According to an embodiment of the invention, the calibration circuits comprised in the monitor and calibration module 330 may be coupled to one or more corresponding signal processing devices, to calibrate a characteristic value of the corresponding signal processing device according to the measured or monitored result.

Figure 4:
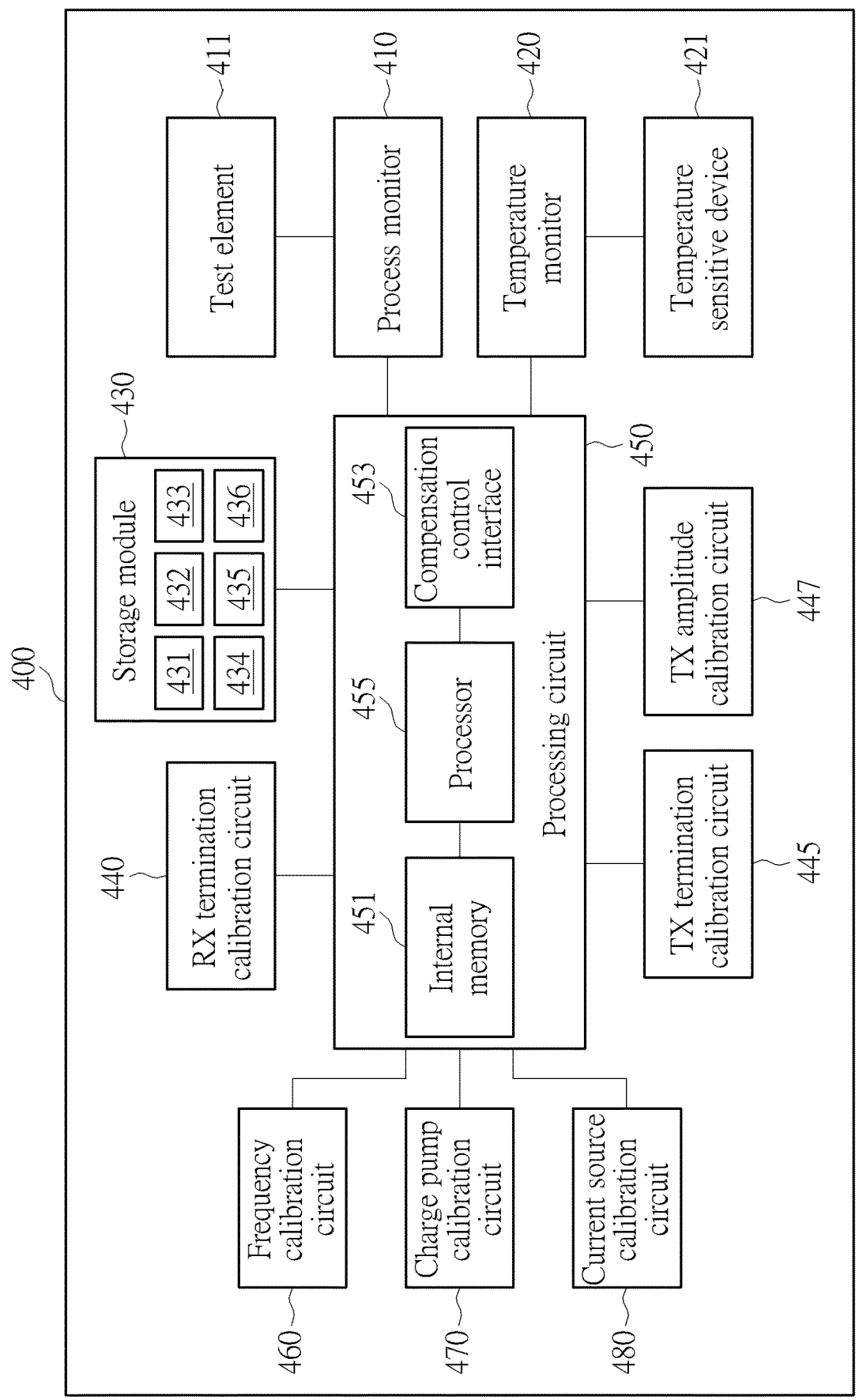
FIG. 4 is an exemplary block diagram of a monitor and calibration module according to an embodiment of the invention.

FIG. 4 is an exemplary block diagram of a monitor and calibration module according to an embodiment of the invention. According to an embodiment of the invention, the monitor and calibration module 400 may comprise a plurality of monitor circuits, a plurality of calibration circuits, a storage module 430 and a processing circuit 450, wherein the processing circuit 450 may be an exemplary implementation according to a first embodiment of the invention.

The monitor circuits in the monitor and calibration module 400 may comprise a process monitor 410, a test element 411, a temperature monitor 420 and a temperature sensitive device 421.

The processing circuit 450 may comprise an internal memory 451, a compensation control interface 453 and a processor 455. The compensation control interface 453 is an interface connecting the processor 455 with a plurality of peripheral monitor circuits, the calibration circuits and the storage module 430. For example, the compensation control interface 453 may be physical traces or buses. The processor 455 may collect measured or monitored results or detection results from the peripheral monitor circuits and may implement a compensation control mechanism to determine content regarding at least one calibration operation based on the measured/monitored results and/or the detection results. The internal memory 451 may comprise at least a read only memory (ROM) and a random access memory (RAM) for storing the program codes, which are executed by the processor 455, corresponding to the compensation control mechanism and the monitor and calibration procedure, and storing the data collected or generated when performing the monitor and calibration procedure.

According to an embodiment of the invention, the process monitor 410 measures and/or monitors a current flowing through the test element 411 or a voltage of the test element 411 to obtain a measured or monitored result with respect to the test element, which reflects the current/voltage performance of the test element 411 under a predetermined condition. The process monitor 410 may determine a process parameter corresponding to the memory controller 110 based on the current/voltage performance of the test element 411 to accordingly generate a process detection result. As an example, the test element 411 may be an active device, such as a diode or a transistor, or may be a passive device, such as a resistor, a capacitor or an inductor. The processor monitor 410 may determine classification of a process corner of the memory controller 110 according to the current/voltage performance of the test element 411. For example, when the current/voltage performance of the test element 411 shows that the speed of electron migration is relatively fast, the process corner classification of the memory controller 110 may be determined as a fast process corner; when the current/voltage performance of the test element 411 shows that the speed of electron migration is relatively slow, the process corner classification of the memory controller 110 may be determined as a slow process corner; and when the current/voltage performance of the test device 411 shows that the speed of electron migration is medium, the process corner classification of the memory controller 110 may be determined as a typical process corner.

It is to be noted that, in the embodiments of the invention, the processor monitor 410 is not limited to be coupled to one test element, and may be coupled to a plurality of test elements. When the processor monitor 410 is coupled to a plurality of test elements, the processor monitor 410 may comprise a plurality of internal monitor circuits (or sub-circuits). Each monitor circuit (or sub-circuit) may be assigned to at least one test element to perform measurement or the monitoring operation on the corresponding test element to obtain the corresponding measured or monitored result.

In addition, it is to be noted that in the embodiments of the invention, the process parameter may be an advanced process corner classification generated or determined by the processor monitor 410 based on a preliminary process corner classification, and the preliminary process corner classification may be the process corner classification (such as the Fast-Fast (FF) corner, Typical-Typical (TT) corner and the Slow-Slow (SS) corner) preliminarily determined or classified by the wafer fabrication plant (wafer fab) when the memory controller 110 is manufactured. In an embodiment of the invention, information regarding the process parameter which indicates the preliminary process corner classification may be recorded in the OTP memory 117 or may be set by a Pin bonding technology. As an example, there may be three pins configured in the memory controller 110, each being corresponding to one of the three process corners FF, TT and SS. When manufacturing the memory controller 110, the pins may be set to specific voltage levels based on the process corner classification result provided by the wafer fab, to indicate the information regarding the preliminary process corner classification. As an example, when the processor corner of the currently manufacturing memory controller chip is classified to TT, the pin of the memory controller corresponding to the TT corner may be coupled to a high voltage on the circuit board through a trace while the pins of the memory controller corresponding to the FF and SS corners may be coupled to a low voltage or a ground voltage on the circuit board through the corresponding traces.

In the embodiments of the invention, the advanced process corner classification may be a one-time operation. That is, the processor monitor 410 may perform the aforementioned measuring/monitoring and detection on the test element after the data storage device 100 is powered on, and the processor monitor 410 may no longer perform the aforementioned measuring/monitoring and detection again until the data storage device 100 is rebooted or is powered off and powered on again (however, the invention is also not limited thereto).

On the contrary, the temperature monitor 420 may keep measuring or monitoring the environment temperature by utilizing the temperature sensitive device 421 to generate a corresponding temperature monitored result.

According to a first embodiment of the invention, the process detection result and the temperature monitored result may be provided to the processor 455 of the processing circuit 450 through the compensation control interface 453. The processor 455 may receive the process detection result and the temperature monitored result and select a reference value subset as a preferred reference value subset for a calibration operation from a plurality of reference value subsets based on the process detection result and the temperature monitored result. In the embodiments of the invention, the storage module 430 may comprise a plurality of storage circuits. Each storage circuit is configured to store a plurality of reference value subsets corresponding to one or more signal processing devices that can be calibrated in the signal processing circuit 300, wherein one reference value subset comprises the appropriate reference values for calibrating one or more characteristic values of the corresponding signal processing device under a specific condition (e.g., a specific combination of a process detection result and a temperature monitored result).

For example but not limited to, in an embodiment of the invention, the storage module 430 may comprise a storage circuit 431 for storing the reference value subsets predefined for RX termination configuration, a storage circuit 432 for storing the reference value subsets predefined for TX termination configuration, a storage circuit 433 for storing the reference value subsets predefined for TX amplitude configuration, a storage circuit 434 for storing the reference value subsets predefined for VCO configuration, a storage circuit 435 for storing the reference value subsets predefined for charge pump configuration, and a storage circuit 436 for storing the reference value subsets predefined for current source circuit configuration. Each storage circuit may store the appropriate reference values for one or more characteristic values of the corresponding signal processing device under each condition.

In the embodiments of the invention, the calibration circuits in the monitor and calibration module 400 may be coupled to the processing circuit 450 and may be coupled to at least one signal processing device in the signal processing circuit 300 to perform the calibration operation on the at least one of the signal processing devices according to the current preferred reference value subset in response to a control signal of the processor 455, to adjust a characteristic value of the at least one of the signal processing devices. The calibration circuit may be configured to set an initial value utilized by the signal processing device in the calibration operation based on a value in the preferred reference value subset, such as setting an initial value of a characteristic value of the signal processing device or setting an initial value of a parameter utilized by the signal processing device. For example, the calibration circuit may sequentially set the characteristic value of the signal processing device to a value in the preferred reference value subset and to one or more fine-tined values obtained by slightly increasing or decreasing said value in the preferred reference value subset to perform the calibration operation, so as to try to find out a setting of the characteristic value which makes the signal processing device to have a better performance. In addition, the calibration circuit may repeatedly perform the aforementioned operations for several times, so as to find out a setting of the characteristic value which makes the signal processing device to have an optimal performance, and adjust the characteristic value of the signal processing device according to this setting.

In the embodiments of the invention, the calibration circuits of the monitor and calibration module 400 may comprise a RX termination calibration circuit 440, a TX termination calibration circuit 445, a TX amplitude calibration circuit 447, a frequency calibration circuit 460, a charge pump calibration circuit 470 and a current source calibration circuit 480.

The RX termination calibration circuit 440 may be coupled to the RX termination circuit 313 or the reference impedance module 312 to perform calibration operation on the RX termination circuit 313 and/or the reference impedance module 312 according to the calibration data (as an example, the preferred reference value subset corresponding to the RX termination configuration) provided by the processor 455, thereby adjusting an impedance value of the predetermined impedance configured inside the RX termination circuit 313 and/or adjusting at least one of the reference resistance, reference capacitance and reference inductance of the reference impedance module 312. The reference value subsets predefined for RX termination configuration and stored in the storage circuit 431 may comprise an initial setting value for calibrating the predetermined impedance inside the RX termination circuit 313 under each condition and/or an appropriate initial value for calibrating the reference resistance, reference capacitance and reference inductance of the reference impedance module 312 under each condition.

The TX termination calibration circuit 445 may be coupled to the TX termination circuit 314 or the reference impedance module 312 to perform calibration operation on the TX termination circuit 314 and/or the reference impedance module 312 according to the calibration data (as an example, the preferred reference value subset corresponding to the TX termination configuration) provided by the processor 455, thereby adjusting an impedance value of the predetermined impedance configured inside the TX termination circuit 314 and/or adjust at least one of the reference resistance, reference capacitance and reference inductance of the reference impedance module 312. The reference value subsets predefined for TX termination configuration and stored in the storage circuit 432 may comprise an initial setting value for calibrating the predetermined impedance inside the TX termination circuit 314 under each condition and/or an appropriate initial value for calibrating the reference resistance, reference capacitance and reference inductance of the reference impedance module 312 under each condition.

The TX amplitude calibration circuit 447 may be coupled to the swing control circuit 307 and/or the TX termination circuit 314 to perform calibration operation on the swing control circuit 307 and/or the TX termination circuit 314 according to the calibration data (as an example, the preferred reference value subset corresponding to the TX amplitude configuration) provided by the processor 455, thereby adjusting a voltage level of an output signal, such as the transmission signal, output by the swing control circuit 307 and/or adjust an impedance value of the predetermined impedance configured inside the TX termination circuit 314. The reference value subsets predefined for TX amplitude configuration and stored in the storage circuit 433 may comprise an initial setting value for calibrating each parameter of the swing control circuit 307 under each condition, an initial setting value for calibrating the predetermined impedance inside the TX termination circuit 314 under each condition and/or an appropriate initial value for calibrating the reference resistance, reference capacitance and reference inductance of the reference impedance module 312 under each condition.

The frequency calibration circuit 460 may be coupled to the frequency synthesizer circuit 311 to perform calibration operation on the frequency synthesizer circuit 311 according to the calibration data (as an example, the preferred reference value subset corresponding to the VCO configuration) provided by the processor 455, thereby adjusting a start-up voltage of the VCO in the frequency synthesizer circuit 311. The reference value subsets predefined for VCO configuration and stored in the storage circuit 434 may comprise an appropriate initial value for calibrating the start-up voltage of the VCO under each condition.

The charge pump calibration circuit 470 may be coupled to the frequency synthesizer circuit 311 or the charge pump circuit 316 to perform calibration operation on the charge pump circuit 316 according to the calibration data (as an example, the preferred reference value subset corresponding to the charge pump configuration) provided by the processor 455, thereby adjusting the frequency of a clock signal received by the charge pump circuit 316 or adjusting a level of an output voltage of the charge pump circuit 316. The reference value subsets predefined for charge pump configuration and stored in the storage circuit 435 may comprise an appropriate initial value for calibrating each parameter of the charge pump under each condition.

The current source calibration circuit 480 may be coupled to the current source circuit 315 to perform calibration operation on the current source circuit 315 according to the calibration data (as an example, the preferred reference value subset corresponding to the current source circuit configuration) provided by the processor 455, to adjust the amount or the level of the current provided by the current source circuit 315. The reference value subsets predefined for current source circuit configuration and stored in the storage circuit 436 may comprise an appropriate initial value for calibrating the amount or the level of the current provided by the current source circuit under each condition.

It is to be noted that in some embodiments of the invention, the calibration circuit may be an independent circuit and may be coupled to the corresponding signal processing device to be calibrated, so as to calibrate a characteristic value of the signal processing device. However, the invention is not limited thereto. In other embodiments of the invention, the calibration circuit may also be implemented as a portion of the signal processing devices to be calibrated. That is, one or more of the signal processing devices to be calibrated may comprise a built-in calibration circuit to calibrate the corresponding characteristic value according to the measured/monitored results, the detection results and/or the calibration data.

Figure 5:
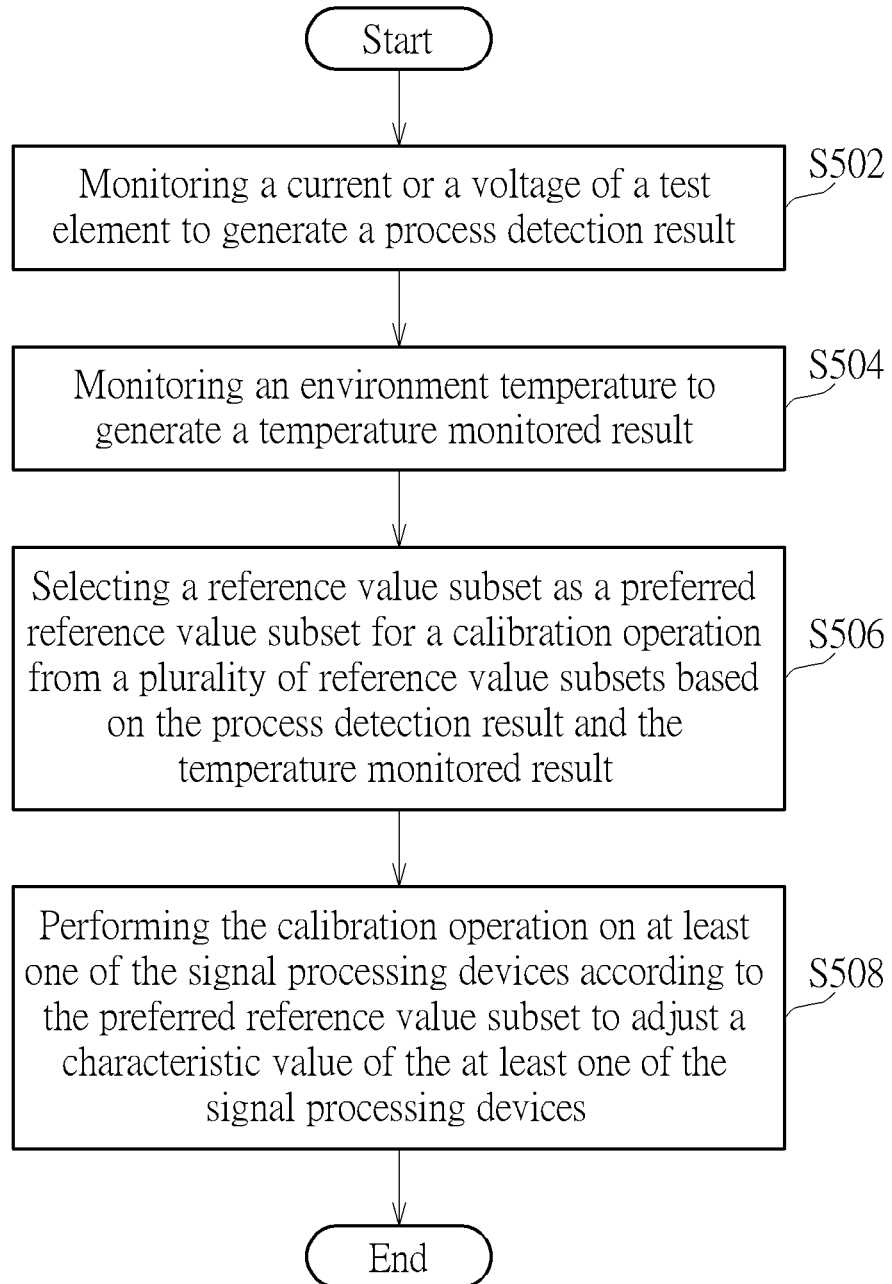
FIG. 5 shows an exemplary flow chart of a method for calibrating characteristic values of a plurality of signal processing devices according to an embodiment of the invention.

FIG. 5 shows an exemplary flow chart of a method for calibrating characteristic values of a plurality of signal processing devices according to an embodiment of the invention. The method may comprise the following steps performed by the monitor and calibration module 330/400:

Step S502: monitoring a current or a voltage of a test element to generate a process detection result.

Step S504: monitoring an environment temperature to generate a temperature monitored result.

Step S506: selecting a reference value subset as a preferred reference value subset for a calibration operation from a plurality of reference value subsets based on the process detection result and the temperature monitored result.

Step S508: performing the calibration operation on at least one of the signal processing devices according to the preferred reference value subset to adjust a characteristic value of the at least one of the signal processing devices.

The proposed method for calibrating characteristic values of signal processing devices is capable of adaptively and accurately select the reference values provided for the calibration circuits according to the process and temperature characteristics, for the calibration circuits to efficiently and accurately calibrate the characteristic values of signal processing devices inside of the SerDes, thereby compensating for drift in current, voltage and/or frequency. It is to be noted that in the embodiments of the invention, the process parameter generated or determined by the process monitor 410 may be utilized to indicate the advanced process corner classification based on the preliminary process corner classification, and the selection of reference values in the embodiments of the invention is performed according to the temperature characteristics and the advanced process corner classification, which will be described in more detailed in the following paragraphs.

Figure 6:
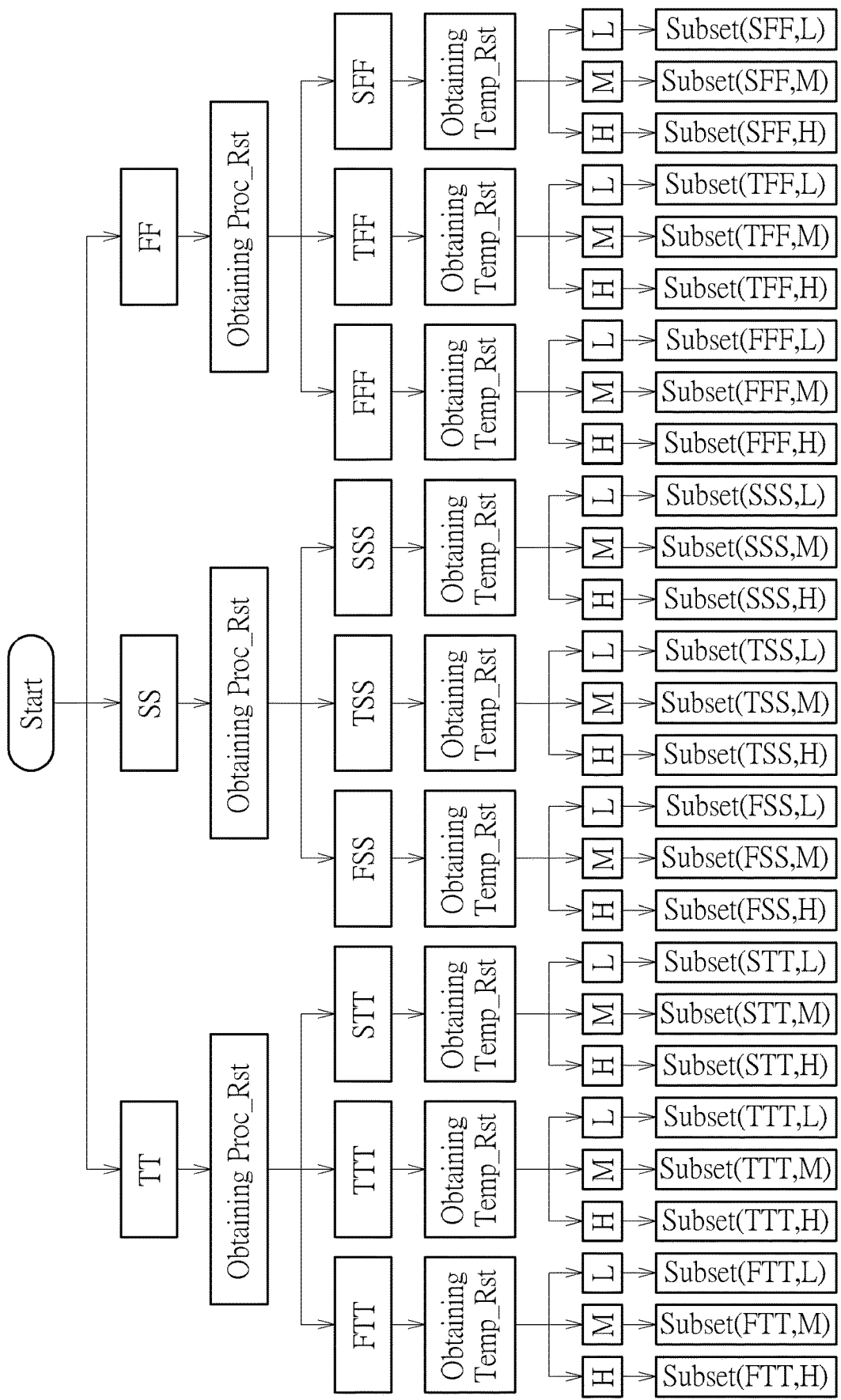
FIG. 6 shows an exemplary flow chart of subset selection according to an embodiment of the invention.

FIG. 6 shows an exemplary flow chart of subset selection according to an embodiment of the invention. In the embodiments of the invention, the subset selection may be triggered when the data storage device 100 is powered on and the power is stable or when a temperature condition has been changed. When the data storage device 100 is powered on and when the power thereof is stable, the processor 455 may first obtain a preset process parameter, such as the aforementioned parameters FF, TT or SS, of the memory controller 110. In the embodiments of the invention, the preset process parameter is a first-level process parameter which indicates a preliminary process corner classification of the memory controller 110. As described above, the processor 455 may obtain information regarding the preliminary process corner classification of the memory controller 110 by reading the OTP memory 117 or by determining the voltage levels of the pins specially configured for the preliminary process corner classification, such as the aforementioned parameters FF, TT or SS.

Then, the processor 455 may obtain the current process detection result (shown in FIG. 6 as "Obtaining Proc_Rst") and determine a second-level process parameter, which indicates the advanced process corner classification under the preliminary process corner classification, such as one of the classifications FTT, TTT, STT, FSS, TSS, SSS, FFF, TFF and SFF, according to the preset process parameter and the current process detection result, wherein for the first letter of the second-level process parameter, the letter F represents Fast, the letter T represents Typical, the letter S represent Slow, and the first letter of the second-level process corner classifications indicates a finer process corner classification made according to the electron migration speed of the device under the preliminary process corner classification. As an example, the classification FTT may represent that the finer process corner classification is in a location of the TT corner with a fast property, the classification TTT may represent that the finer process corner classification is in a location of the TT corner with a typical property, the classification STT may represent that the finer process corner classification is in a location of the TT corner with a slow property, the classification FSS may represent that the finer process corner classification is in a location of the SS corner with a fast property, the classification TSS may represent that the finer process corner classification is in a location of the SS corner with a typical property, the classification SSS may represent that the finer process corner classification is in a location of the SS corner with a slow property, the classification FFF may represent that the finer process corner classification is in a location of the FF corner with a fast property, the classification TFF may represent that the finer process corner classification is in a location of the FF corner with a typical property, and the classification SFF may represent that the finer process corner classification is in a location of the FF corner with a slow property.

When two identical devices (for example, two manufactured memory controllers) have the same preliminary process corner classification but different advanced process corner classifications, the reference values suitable for the corresponding calibration operations may be different. Therefore, different reference value subsets can be given to different advanced process corner classifications (such as, but not limited to, the FTT, TTT, STT, FSS, TSS, SSS, FFF, TFF, and SFF shown in FIG. 6), and for two different subsets, the reference value of at least one (but not limited to one) parameter may be different.

When the second-level process parameter is determined, the processor 455 may further obtain the temperature monitored result (shown in FIG. 6 as "Obtaining Temp_Rst") and determine whether the current temperature is a high temperature (represented by the letter H in FIG. 6), a medium temperature (represented by the letter M in FIG. 6) or a low temperature (represented by the letter L in FIG. 6). Under different temperature conditions, the reference vales suitable for the calibration operations may be different. Therefore, different temperature monitored results may correspond to different reference value subsets, and for two different subsets, the reference value of at least one (but not limited to one) parameter may be different.

When the classification of the second-level process parameter and the current temperature condition is determined, the processor 455 may accordingly select one reference value subset from the plurality of reference value subsets as a preferred reference value subset suitable for the current calibration operation. In an embodiment of the invention, suppose that the first-level process parameter comprises three process corner classifications, the second-level process parameter comprises three process corner classifications and the monitored environment temperature may be classified into three different results, each storage circuit in the storage module 430 may store at least (3*3*3)=27 reference value subsets for the corresponding calibration circuit, such as the reference value subsets Subset (FTT,H), Subset (FTT,M), Subset (FTT,L), Subset (TTT,H), Subset (TTT,M), Subset (TTT,L), Subset (STT,H), Subset (STT,M), Subset (STT,L), Subset (FSS,H), Subset (FSS,M), Subset (FSS,L), Subset (TSS,H), Subset (TSS,M), Subset (TSS,L), Subset (SSS,H), Subset (SSS,M), Subset (SSS,L), Subset (FFF,H), Subset (FFF,M), Subset (FFF,L), Subset (TFF,H), Subset (TFF,M), Subset (TFF,L), Subset (SFF,H), Subset (SFF,M) and Subset (SFF,L) shown in FIG. 6.

It is to be noted that the flow chart shown in FIG. 6 is applicable for selecting the preferred reference value subset suitable for the calibration operation for each calibration circuit/each signal processing circuit. In addition, the number of subsets illustrated in FIG. 6 is merely one of the embodiments of the invention, and the invention should not be limited thereto.

In addition, in the embodiments of the invention, the processor 455 may keep receiving the latest temperature monitored result from the temperature monitor 420 and determine whether to re-perform the calibration operation according to the latest temperature monitored result. As an example, when the temperature condition changes or when a difference between the latest temperature monitored result and a previous obtained temperature monitored result is greater than a temperature difference threshold, the processor 455 may determine to re-perform the calibration operation. When the processor 455 determines that re-performance of the calibration operation is required, the subset selection flow shown in FIG. 6 may be triggered again, or, since the first-level process parameter and the second-level process parameter are already known and are not changed, the processor 455 may start the subset selection flow from the temperature condition corresponding to the latest temperature monitored result to select another preferred reference value subset.

According to an embodiment of the invention, after the calibration operation is completed, the calibration circuit may report the calibration result to the processor 455. For example, the calibration circuit may report the final calibrated result of the characteristic value obtained after the calibration to the processor 455. The processor 455 may further determine whether a difference between the final calibrated result of the characteristic value of the at least one of the signal processing devices and a corresponding value in the preferred reference value subset which was provided to the calibration circuit is greater than a threshold value, and when the difference is greater than the threshold value, the processor 455 may be further configured to modify the content stored in the corresponding storage circuit of the corresponding value in the reference value subset selected as the preferred reference value subset according to the difference or according to the final calibrated result of the characteristic value. In other words, in some embodiments of the invention, the content of the reference value subset may be modified based on the calibration result. In this manner, when the calibration operation is performed again under the same process parameter and temperature condition, the characteristic value or parameter of the corresponding signal processing device may be set according to the modified content of the reference value subset (which may be different from the content of the predefined reference value subset).

It is to be noted that, in the embodiments of the invention, the processor 455 may also not directly modify the content stored in the corresponding storage circuit, but modify its replica. To be more specific, in some embodiments of the invention, the storage circuits 431-436 may also be implemented as ROM or the OTP memory, and the storage module 430 may further comprise one or more registers configured to store the same reference value subsets for possible modification. When the processor 455 determines that the content of the reference value subset has to be modified, the processor 455 may modify the corresponding replica and keep the content stored in the storage circuits 431-436 from being changed. The processor 455 may perform some corresponding settings to select whether to obtain the content of the replica or the original content stored in the storage circuits as the preferred reference value subset provided to the calibration circuit. For example, when the data storage device 100 is kept being provided with power, the processor 455 may determine to select the content of the replica as the preferred reference value subset provided to the calibration circuit, and when the data storage device 100 has been rebooted, the processor 455 may determine to select the original content stored in the storage circuits as the preferred reference value subset provided to the calibration circuit.

In the embodiments of the invention, the compensation control mechanism may describe or define detailed content of at least one of the monitor operation and the calibration operation and the content of calibration operation corresponding to each kind of measured/monitored result. The content of a monitor operation may comprise the information regarding which monitor circuit is arranged to perform the monitor operation and on which test element the monitor operation is to be performed, the start time of the monitor operation and the length of execution time of the monitor operation, the target (for example, a current signal or a voltage signal, etc.) to be monitored in the monitor operation, the way to report the monitored result, and the temperature difference threshold utilized to determine whether the difference between temperature monitored results is large, etc., The content of a monitor operation may also comprise the information regarding whether the monitor operation is defined as a one-shot monitor operation or a repeated monitor operation, or a monitoring sequence or an activation sequence when the monitor operation is a combination of a group of monitor operations that have to be sequentially performed by multiple monitor circuits.

In addition, in the embodiments of the invention, the compensation control mechanism may further describe content of the calibration operation configured in response to each kind of measured/monitored result, and the content of a calibration operation may comprise information regarding which calibration circuit is arranged to perform the calibration operation, the start time of the calibration operation and the length of execution time of the calibration operation, the target (for example, which characteristic value of which signal processing device) to be calibrated in the calibration operation, the amount of calibration (or the amount of adjustment) in the calibration operation, the way to report the calibration result, etc., The content of a calibration operation may also comprise the information regarding whether the calibration operation is defined as a one-shot calibration operation or a repeated calibration operation, or a calibration sequence or an activation sequence when the calibration operation is a combination of a group of calibration operations that have to be sequentially performed by multiple calibration circuits.

It is to be noted that the monitor and calibration module shown in FIG. 4 is only an implementation of the first embodiment of the invention, and is certainly not a limit of the invention. In another embodiment of the invention, the monitor and calibration module may also be implemented in a different way.

Figure 7:
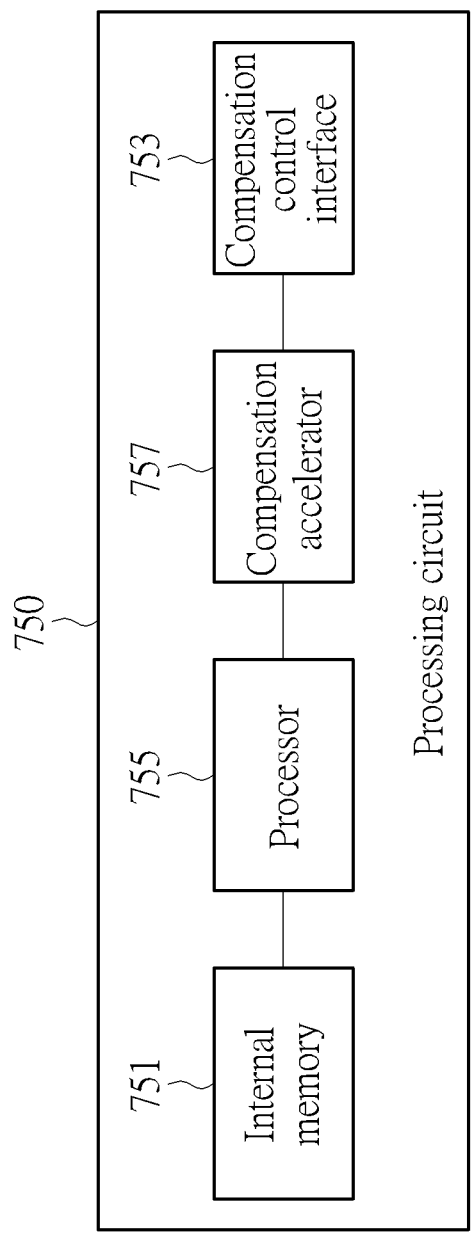
FIG. 7 is an exemplary block diagram of the processing circuit configured in the monitor and calibration module according to a second embodiment of the invention.

FIG. 7 is an exemplary block diagram of the processing circuit configured in the monitor and calibration module according to a second embodiment of the invention. In this embodiment, the processing circuit 450 as shown in FIG. 4 is replaced by the processing circuit 750. That is, in this embodiment, the monitor and calibration module may comprise a plurality of monitor circuits, a plurality of calibration circuits and a storage module as shown in FIG. 4 and the processing circuit 750 as shown in FIG. 7. Therefore, regarding the descriptions of the monitor circuits, calibration circuits and storage module coupled to the processing circuit 750, reference may be made to the paragraphs related to FIG. 4-FIG. 6, and are not repeated here for brevity. As an example, the operations, such as the operations of receiving the process detection result and the temperature monitored result, selecting the preferred reference value subset or performing determinations or decisions, of the processor 450 described above in the paragraphs related to FIG. 4-FIG. 6 may be performed by the processor 755 (or the processor 855) in this embodiment (or the embodiment shown in FIG. 8) instead.

The processing circuit 750 may comprise an internal memory 751, a compensation control interface 753, a compensation accelerator 757 and a processor 755. The compensation control interface 753 is an interface connecting the compensation accelerator 757 with a plurality of peripheral monitor circuits, calibration circuits and the storage module. For example, the compensation control interface 753 may be physical traces or buses. The compensation accelerator 757 may collect measured, monitored and/or detection results from the peripheral monitor circuits, sequentially generate corresponding control signals according to the commands issued by the processor 755 and provide the control signals to the corresponding monitor circuits, calibration circuits and the storage circuits, for the monitor circuits, calibration circuits and the storage circuits to respectively perform the corresponding monitor operations, calibration operations and access operations in response to the corresponding control signals. The processor 755 may implement a compensation control mechanism to determine at least one calibration operation based on the measured/monitored results and detection results and generate a corresponding command. The internal memory 751 may comprise at least a ROM and a RAM for storing the program codes, which are executed by the processor 755, corresponding to the compensation control mechanism and the monitor and calibration procedure, and storing the data collected or generated when performing the monitor and calibration procedure.

Figure 8:
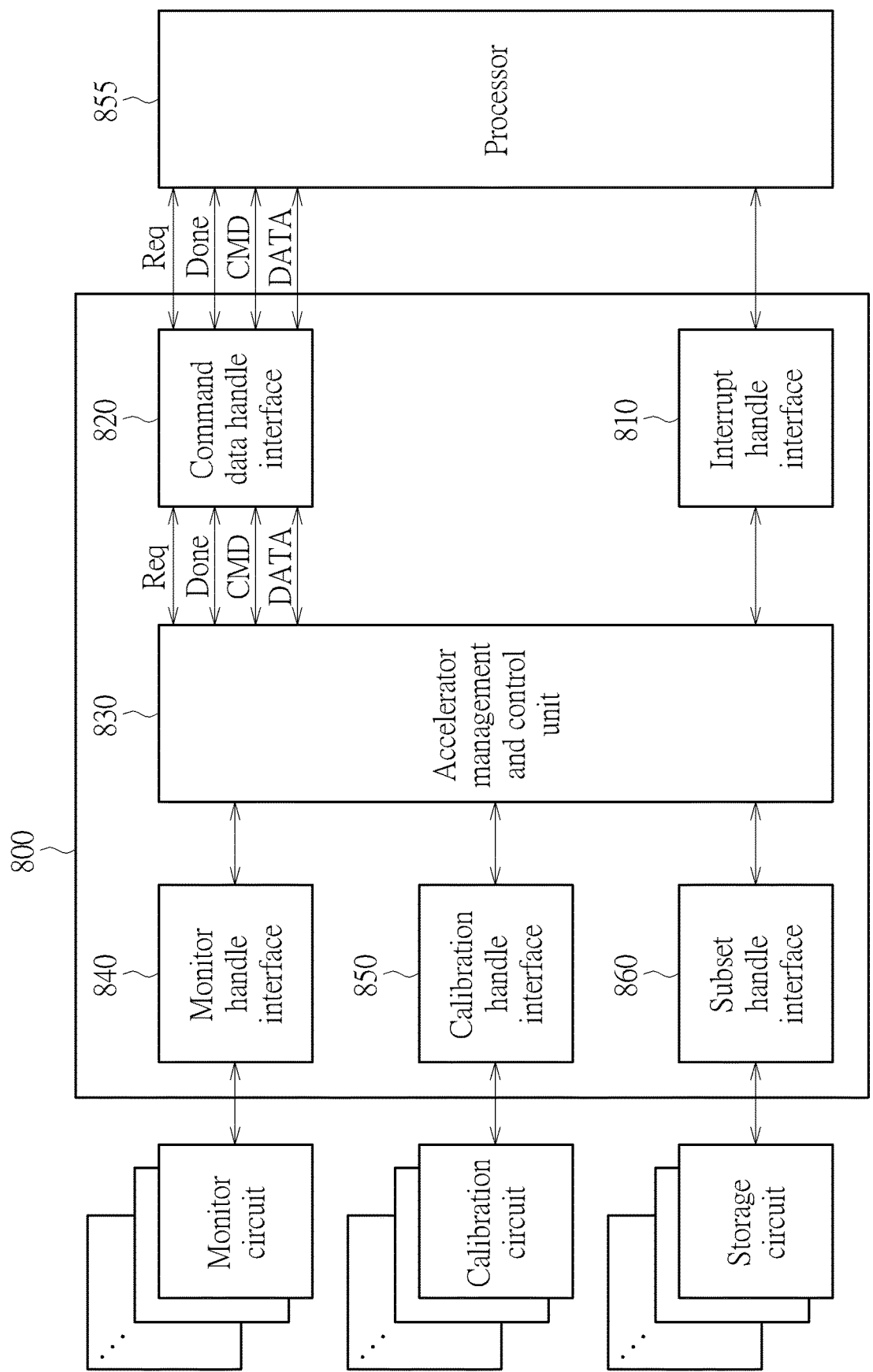
FIG. 8 shows an exemplary block diagram of a compensation accelerator configured in the processing circuit according to an embodiment of the invention.

FIG. 8 shows an exemplary block diagram of a compensation accelerator configured in the processing circuit according to an embodiment of the invention. The compensation accelerator 800 may comprise an interrupt handle interface 810, a command data handle interface 820, an accelerator management and control unit 830, a monitor handle interface 840, a calibration handle interface 850 and a subset handle interface 860. The interrupt handle interface 810 is coupled to the monitor circuits and the calibration circuits in the monitor and calibration module and configured to manage a plurality of interrupt requests received from the monitor circuits and the calibration circuits, buffer the interrupt requests and generate an interrupt notification signal according to the interrupt requests, and issue the interrupt notification signal to the processor 855. According to an embodiment of the invention, the processor 855 is configured to sequentially handle events corresponding to the interrupt requests according to the interrupt notification signal and issue a process complete notification to the interrupt handle interface 810 after completion of an event to notify the interrupt handle interface 810 about the completion of the event. The interrupt handle interface 810 may be further configured to delete the interrupt request corresponding to the event in response to the process complete notification and report the event processing result to the accelerator management and control unit 830.

The command data handle interface 820 is configured to buffer a plurality of commands CMD and data DATA, wherein the commands CMD comprise the calibration commands and the subset selection commands issued by the processor 855, the data DATA comprises the measured/monitored results and the detection result collected from the monitor circuits, the calibration results collected from the calibration circuits and calibration data (for example, information indicating the storage position, the index or the content of the preferred reference subset) corresponding to the calibration commands and provided by the processor 855. The command data handle interface 820 may comprise a command queue and a data queue to respectively buffer the commands CMD and the data DATA and transmit the commands CMD and the data DATA between the accelerator management and control unit 830 and the processor 855. In addition, the command data handle interface 820 may also receive request messages Req and operation complete notification messages Done from the monitor circuits and calibration circuits, as an example, the operation complete notification message issued by a monitor circuit after completion of a monitor operation or the operation complete notification message issued by a calibration circuit after completion of a calibration operation, via the accelerator management and control unit 830 and transmit the request messages Req and the operation complete notification messages Done to the processor 855.

The accelerator management and control unit 830 is configured to determine a next operation in the monitor and calibration procedure, as an example, which monitor circuit should perform the next monitor operation or which calibration circuit should perform the next calibration operation, according to the commands issued by the processor 855 and an event processing result reported by the interrupt handle interface 810, and accordingly generate a monitor control signal or a calibration control signal.

In addition, the accelerator management and control unit 830 is also configured to determine to access which storage circuit according to the subset selection command issued by the processor 855 and generate the corresponding read control signal.

The monitor handle interface 840 is coupled to the accelerator management and control unit 830 and the monitor circuits in the monitor and calibration module and configured to receive and decode the monitor control signal and provide a decoded monitor control signal to one of the monitor circuits according to a decoding result of the monitor control signal.

The calibration handle interface 850 is coupled to the accelerator management and control unit 830 and the calibration circuits in the monitor and calibration module and configured to receive and decode the calibration control signal and provide a decoded calibration control signal to one of the calibration circuits according to a decoding result of the calibration control signal.

The subset handle interface 860 is coupled to the accelerator management and control unit 830, the calibration handle interface 850 and the storage circuits (and/or the aforementioned registers configured in the storage module for storing the replicas of the reference value subsets which can be modified) in the monitor and calibration module and configured to receive and decode the read control signal and read the content of the corresponding reference value subset (e.g., the preferred reference value subset) according to a decoding result of the read control signal and provide the read content to the calibration handle interface 850. In the embodiments of the invention, the calibration handle interface 850 may buffer the preferred reference value subset and provide it to the corresponding calibration circuit as the calibration data through the calibration control signal. In this manner, the calibration circuit may perform the calibration operation on the signal processing device according to the preferred reference value subset in response to the control signal (which is equivalent to the control signal from the processor 855) to adjust a characteristic value of the corresponding signal processing device.

Figure 9:
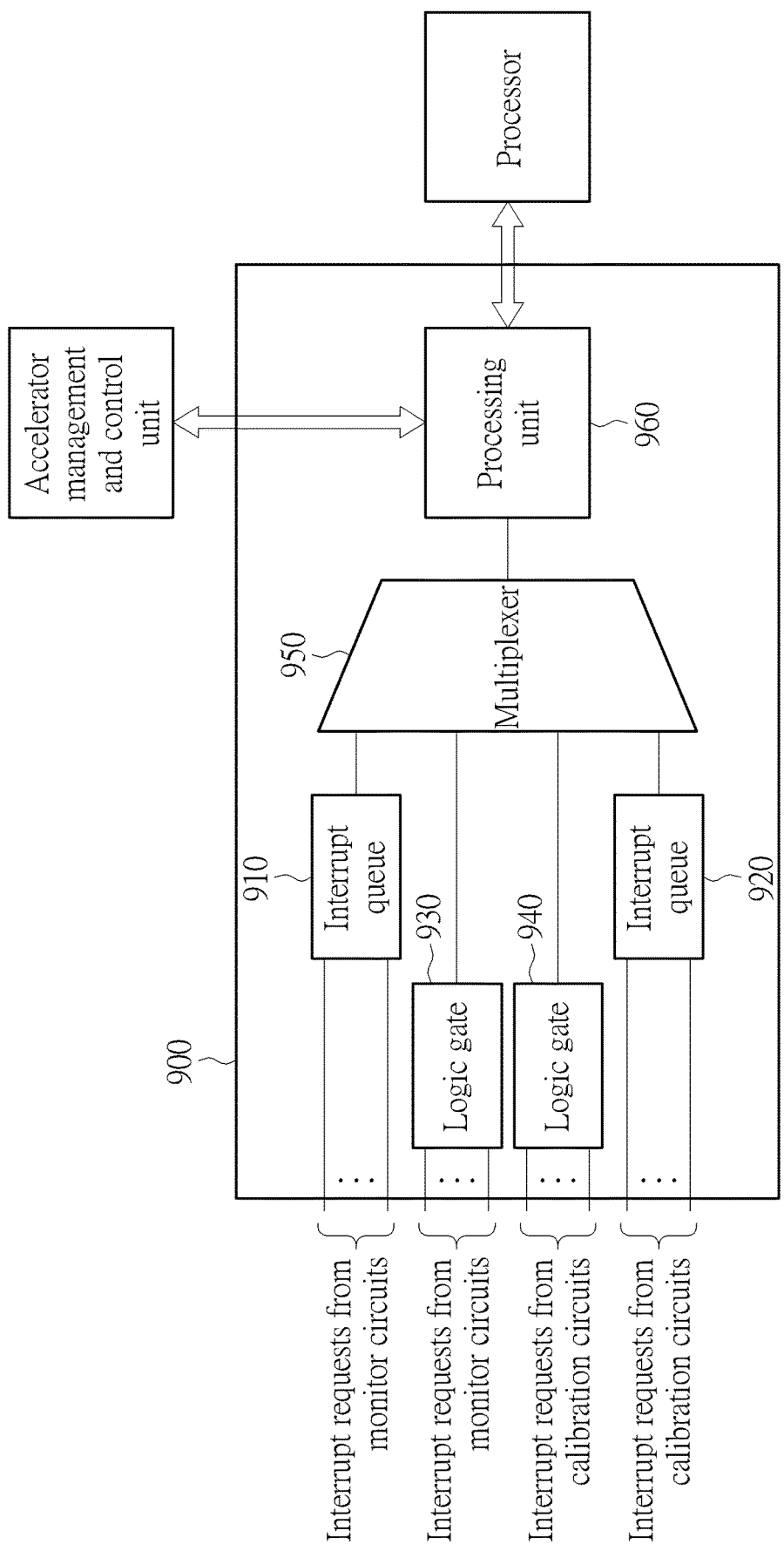
FIG. 9 shows an exemplary block diagram of an interrupt handle interface configured inside the compensation accelerator according to an embodiment of the invention.

FIG. 9 shows an exemplary block diagram of an interrupt handle interface configured inside the compensation accelerator according to an embodiment of the invention. The interrupt handle interface 900 may comprise interrupt queues 910 and 920, logic gates 930 and 940, a multiplexer 950 and a processing unit 960. The interrupt queue 910 is coupled to the interrupt request transmission lines of all the monitor circuits to receive the interrupt requests from the monitor circuits. The logic gate 930 is also coupled to the interrupt request transmission lines of all the monitor circuits to receive the same interrupt requests from the monitor circuits and perform a logic operation, as an example but not limited to, a logic OR operation, on the received interrupt requests, so as to provide a quick notification path to the processing unit 960. Similarly, the interrupt queue 920 is coupled to the interrupt request transmission lines of all the calibration circuits to receive the interrupt requests from the calibration circuits. The logic gate 940 is also coupled to interrupt request transmission lines of all the calibration circuits to receive the same interrupt requests from the calibration circuits and perform a logic operation, as an example but not limited to, a logic OR operation, on the received interrupt requests, so as to provide a quick notification path to the processing unit 960.

The multiplexer 950 selectively provides the outputs of the interrupt queues 910 and 920, and the outputs of the logic gates 930 and 940 to the processing unit 960. The processing unit 960 may manage and classify the interrupt requests, generate an interrupt notification signal according to the interrupt requests, and issue the interrupt notification signal to the processor in the processing circuit. In addition, the processing unit 960 may receive the process complete notification from the processor and delete the interrupt request buffered in the interrupt queue in response to the received process complete notification and report an event processing result to the accelerator management and control unit for the accelerator management and control unit to determine a next operation in the monitor and calibration procedure according to the event processing result and the commands issued by the processor.

Different from the calibration operation in the prior art, the proposed method for calibrating characteristic values of signal processing devices is capable of adaptively and accurately select the reference values provided for the calibration circuits according to the process and temperature characteristics, for the calibration circuits to efficiently and accurately calibrate the characteristic values of signal processing devices inside of the SerDes, thereby compensating for drift in current, voltage and/or frequency. In addition, in the embodiments of the invention, the process parameter generated or determined by the processor monitor 410 is a parameter indicating an advanced process corner classification based on a preliminary process corner classification. Therefore, selection of reference values in the embodiments of the invention is performed based on finer process corner classifications and temperature characteristic as compared to the prior art, which facilitates the calibration circuit to efficiently and accurately find out the settings of the characteristic values that make the signal processing device to have optimal performance via the calibration operation and effectively improve the yield rate of memory controller products.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An interface circuit, comprising:
 a signal processing circuit, configured to process a reception signal received from a host device and a transmission signal to be transmitted to the host device,
 wherein the signal processing circuit comprises:
 a plurality of signal processing devices; and
 a monitor and calibration module, comprising:
 a process monitor, configured to monitor a current or a voltage of a test element to generate a process detection result;

a temperature monitor, configured to monitor an environment temperature to generate a temperature monitored result;

a processor, configured to receive the process detection result and the temperature monitored result and select a reference value subset as a preferred reference value subset for a calibration operation from a plurality of reference value subsets based on the process detection result and the temperature monitored result; and a calibration circuit, coupled to the processor and at least one of the plurality of signal processing devices and configured to perform the calibration operation on the at least one of the plurality of signal processing devices according to the preferred reference value subset and in response to a control signal issued by the processer, to adjust a characteristic value of the at least one of the plurality of signal processing devices.

2. The interface circuit of claim 1, wherein the interface circuit is configured inside of a memory controller and the signal processing circuit is a Serializer-Deserializer (SerDes).

3. The interface circuit of claim 2, wherein the processor is further configured to obtain a preset process parameter which is a first-level process parameter, determine a second-level process parameter according to the preset process parameter and the process detection result, and select the reference value subset as the preferred reference value subset according to the second-level process parameter and the temperature monitored result.

4. The interface circuit of claim 3, wherein the first-level process parameter indicates a preliminary process corner classification and the second-level process parameter indicates an advanced process corner classification.

5. The interface circuit of claim 1, wherein the calibration circuit is configured to set an initial value utilized by the at least one of the plurality of signal processing devices in the calibration operation based on a value in the preferred reference value subset.

6. The interface circuit of claim 1, wherein the processor is configured to keep receiving a latest temperature monitored result and determine whether to re-perform the calibration operation according to the latest temperature monitored result, wherein when the calibration operation is determined to be re-performed, the processor is further configured to select another preferred reference value subset from the plurality of reference value subsets for re-performing the calibration operation based on the process detection result and the latest temperature monitored result.

7. The interface circuit of claim 1, wherein after the calibration operation is completed, the processor is further configured to determine whether a difference between the characteristic value of the at least one of the plurality of signal processing devices and a corresponding value in the preferred reference value subset is greater than a threshold value, and when the difference is greater than the threshold value, the processor is further configured to modify a corresponding value in the reference value subset which was as selected the preferred reference value subset according to the difference.

8. A memory controller, coupled to a memory device to control access operations of the memory device, comprising:

a host interface, configured to communicate with a host device and comprising a signal processing circuit to process a reception signal received from the host device and a transmission signal to be transmitted to the host device, wherein the signal processing circuit comprises:
a plurality of signal processing devices; and
a monitor and calibration module, comprising:
a process monitor, configured to monitor a current or a voltage of a test element to generate a process detection result;
a temperature monitor, configured to monitor an environment temperature to generate a temperature monitored result;
a processor, configured to receive the process detection result and the temperature monitored result and select a reference value subset as a preferred reference value subset for a calibration operation from a plurality of reference value subsets based on the process detection result and the temperature monitored result; and
a calibration circuit, coupled to the processor and at least one of the plurality of signal processing devices and configured to perform the calibration operation on the at least one of the plurality of signal processing devices according to the preferred reference value subset in response to a control signal issued by the processor to adjust a characteristic value of the at least one of the plurality of signal processing devices.

9. The memory controller of claim 8, wherein the signal processing circuit is a Serializer-Deserializer (SerDes).

10. The memory controller of claim 8, wherein the processor is further configured to obtain a preset process parameter which is a first-level process parameter, determine a second-level process parameter according to the preset process parameter and the process detection result, and select the reference value subset as the preferred reference value subset according to the second-level process parameter and the temperature monitored result.

11. The memory controller of claim 10, wherein the first-level process parameter indicates a preliminary process corner classification and the second-level s parameter indicates an advanced process corner classification.

12. The memory controller of claim 8, wherein the calibration circuit is configured to set an initial value utilized by the at least one of the plurality of signal processing devices in the calibration operation based on a value in the preferred reference value subset.

13. The memory controller of claim 8, wherein the processor is configured to keep receiving a latest temperature monitored result and determine whether to re-perform the calibration operation according to the latest temperature monitored result, wherein when the calibration operation is determined to be re-performed, the processor is further configured to select another preferred reference value subset from the plurality of reference value subsets for re-performing the calibration operation based on the process detection result and the latest temperature monitored result.

14. The memory controller of claim 8, wherein after the calibration operation is completed, the processor is further configured to determine whether a difference between the characteristic value of the at least one of the plurality of signal processing devices and a corresponding value in the preferred reference value subset is greater than a threshold value, and when the difference is greater than the threshold value, the processor is further configured to modify a corresponding value in the reference value subset which was selected as the preferred reference value subset according to the difference.

15. A method for calibrating characteristic values of a plurality of signal processing devices comprised in SerDes inside of an interface circuit of a memory controller, comprising:
- monitoring a current or a voltage of a test element to generate a process detection result by a monitor and calibration module;
- monitoring an environment temperature to generate a temperature monitored result by the monitor and calibration module;
- selecting a reference value subset as a preferred reference value subset for a calibration operation from a plurality of reference value subsets based on the process detection result and the temperature monitored result; and
- performing the calibration operation on at least one of the plurality of signal processing devices by at least one calibration circuit of the monitor and calibration module according to the preferred reference value subset to adjust a characteristic value of the at least one of the plurality of signal processing devices.

16. The method of claim 15, wherein step of selecting the reference value subset as the preferred reference value subset for the calibration operation from the plurality of reference value subsets based on the process detection result and the temperature monitored result further comprises:
- obtaining a preset process parameter, wherein the preset process parameter is a first-level process parameter;
- determining a second-level process parameter according to the preset process parameter and the process detection result; and
- selecting the reference value subset as the preferred reference value subset according to the second-level process parameter and the temperature monitored result.

17. The method of claim 16, wherein the first-level process parameter indicates a preliminary process corner classification and the second-level process parameter indicates an advanced process corner classification.

18. The method of claim 15, wherein step of performing the calibration operation on the at least one of the plurality of signal processing devices by the at least one calibration circuit of the monitor and calibration module according to the preferred reference value subset further comprises:
- setting an initial value utilized by the at least one of the plurality of signal processing devices in the calibration operation based on a value in the preferred reference value subset.

19. The method of claim 15, further comprising:
- keep monitoring the environment temperature by the monitor and calibration module to generate a latest temperature monitored result;
- determining whether to re-perform the calibration operation according to the latest temperature monitored result; and
- selecting another preferred reference value subset from the plurality of reference value subsets for re-performing the calibration operation based on the process detection result and the latest temperature monitored result.

20. The method of claim 15, further comprising:
- determining whether a difference between the characteristic value of the at least one of the plurality of signal processing devices and a corresponding value in the preferred reference value subset is greater than a threshold value; and
- modifying a corresponding value in the reference value subset which was selected as the preferred reference value subset according to the difference when the difference is greater than the threshold value.

* * * * *